(12) United States Patent
Choi et al.

(10) Patent No.: US 10,466,558 B2
(45) Date of Patent: Nov. 5, 2019

(54) DISPLAY SUBSTRATE AND METHOD OF MANUFACTURING THE SAME

(71) Applicant: Samsung Display Co., Ltd., Yongin-Si, Gyeonggi-Do (KR)

(72) Inventors: Moon-Keun Choi, Hwaseong-si (KR); Sijin Kim, Seoul (KR); Hyun-Jung Lee, Dongducheon-si (KR); Yeontaek Jeong, Seoul (KR); Seungjoo Choi, Incheon (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/616,276

(22) Filed: Jun. 7, 2017

(65) Prior Publication Data

US 2018/0033803 A1 Feb. 1, 2018

(30) Foreign Application Priority Data

Jul. 29, 2016 (KR) .................. 10-2016-0096840

(51) Int. Cl.
*G02F 1/1339* (2006.01)
*G02F 1/1368* (2006.01)
*G02F 1/1333* (2006.01)
*G02F 1/1337* (2006.01)

(52) U.S. Cl.
CPC ........ *G02F 1/1368* (2013.01); *G02F 1/13394* (2013.01); *G02F 1/1337* (2013.01); *G02F 1/133345* (2013.01); *G02F 2001/13398* (2013.01); *G02F 2201/50* (2013.01); *G02F 2202/28* (2013.01)

(58) Field of Classification Search
CPC .................... G02F 1/13394; G02F 1/1368
See application file for complete search history.

(56) References Cited

U.S. PATENT DOCUMENTS

| | | | | |
|---|---|---|---|---|
| 2011/0222016 A1* | 9/2011 | Kaneko | ............... | G02F 1/13394 349/155 |
| 2015/0098041 A1* | 4/2015 | Jung | ................... | G02F 1/13394 349/46 |
| 2016/0077369 A1* | 3/2016 | Kim | .................... | G02F 1/13394 349/43 |

FOREIGN PATENT DOCUMENTS

| | | |
|---|---|---|
| KR | 1020140073271 A | 6/2014 |
| KR | 1020150040648 A | 4/2015 |
| KR | 1020150106305 A | 9/2015 |

OTHER PUBLICATIONS

Cheung, et al., Silicon Nitride Surface Preparation to Prevent Photoresist Blister Defects, Microelctronics, Northrop Grumman Space Technology, Jan. 2005, pp. 1-2.

* cited by examiner

*Primary Examiner* — Thanh Nhan P Nguyen
(74) *Attorney, Agent, or Firm* — Cantor Colburn LLP

(57) ABSTRACT

A display substrate includes a base substrate, a switching element disposed on the base substrate a first layer disposed on the switching element, a first electrode disposed on the first layer, an insulation layer disposed on the first electrode, and a spacer disposed on the contact hole of the insulation layer. The switching element includes a gate electrode, a source electrode, and a drain electrode. A contact hole is defined in the insulation layer to partially exposing expose a portion of the first electrode.

15 Claims, 12 Drawing Sheets

DISPLAY SUBSTRATE AND METHOD OF MANUFACTURING THE SAME

This application claims priority to Korean Patent Application No. 10-2016-0096840, filed on Jul. 29, 2016, and all the benefits accruing therefrom under 35 U.S.C. § 119, the content of which in its entirety is herein incorporated by reference.

BACKGROUND

1. Field

Exemplary embodiments of the invention relate to a display substrate and a method of manufacturing the display substrate.

2. Description of the Related Art

As demands on various type of display devices have recently increased with the development of an information society, studies on display devices, such as a liquid crystal display ("LCD") device, a plasma display panel ("PDP") device, a field emission display ("FED") device, and an electrophoretic display ("EPD") device and an organic light emitting display ("OLED") device, have been actively conducted.

Generally, an LCD panel includes a thin film transistor ("TFT") substrate, a counter substrate and a liquid crystal ("LC") layer. The TFT substrate typically includes a plurality of gate lines, a plurality of data lines crossing the gate lines, a plurality of TFTs connected with the gate lines and data lines, and a plurality of pixel electrodes connected with the TFTs. The TFT may include a gate electrode extended from the gate line, a source electrode extended to the data line, and a drain electrode spaced apart from the source electrode.

SUMMARY

In a liquid crystal display ("LCD") panel, a column spacer may be provided between the thin film transistor ("TFT") substrate and the counter substrate to maintain a cell gap. However, an alignment film may be scratched by the column spacer if the column spacer is moved by an external force in a horizontal direction. Accordingly, the display device may have some defects when the alignment film is scratched.

Exemplary embodiments of the invention provide a display substrate in which defects caused by an external force in a horizontal direction may be effectively prevented or substantially reduced.

Exemplary embodiments of the invention also provide a method of manufacturing the display substrate.

In an exemplary embodiment of a display substrate according to the invention, the display substrate includes a base substrate, a switching element disposed on the base substrate, where the switching element includes a gate electrode electrically connected to a gate line extending in a first direction, a source electrode electrically connected to a data line extending in a second direction crossing the first direction, and a drain electrode spaced apart from the source electrode, an organic layer disposed on the switching element, a first electrode disposed on the organic layer, an insulation layer disposed on the first electrode, where a contact hole is defined in the insulation layer to expose the first electrode, and a column spacer disposed on the contact hole of the insulation layer.

In an exemplary embodiment, the column spacer directly may contact the exposed portion of the first electrode.

In an exemplary embodiment, a thickness of the insulation layer may be greater than or equal to about 1.8 micrometers (μm) and less than or equal to about 2.2 μm.

In an exemplary embodiment, the display substrate may further include an adhesive pattern disposed on the insulation layer to cover the contact hole.

In an exemplary embodiment, the column spacer may directly contact the adhesive pattern.

In an exemplary embodiment, the adhesive pattern may include substantially the same material as the first electrode.

In an exemplary embodiment, the adhesive pattern may directly contact the first electrode.

In an exemplary embodiment, a thickness of the insulation layer may be greater than or equal to about 1.8 μm and less than or equal to about 2.2 μm.

In an exemplary embodiment of a display substrate according to the invention, the display substrate includes a base substrate, a switching element disposed on the base substrate, where the switching element includes a gate electrode electrically connected to a gate line extending in a first direction, a source electrode electrically connected to a data line extending in a second direction crossing the first direction, and a drain electrode spaced apart from the source electrode, an organic layer disposed on the switching element, a first electrode disposed on the organic layer, an insulation layer disposed on the first electrode, an adhesive electrode disposed on the insulation layer, and a column spacer disposed on the adhesive electrode In an exemplary embodiment, the column spacer may directly contact the adhesive electrode.

In an exemplary embodiment, the adhesive electrode may include substantially the same material as the first electrode.

In an exemplary embodiment, a thickness of the insulation layer may be greater than or equal to about 1.8 μm and less than or equal to about 2.2 μm.

In an exemplary embodiment of a method of manufacturing a display substrate, the method includes providing a switching element on a base substrate, where the switching element includes a gate electrode electrically connected to a gate line extending in a first direction, a source electrode electrically connected to a data line extending in a second direction crossing the first direction, and a drain electrode spaced apart from the source electrode, providing an organic layer on the switching element, providing a first electrode on the organic layer, providing an insulation layer on the organic layer, and providing a column spacer on the insulation layer.

In an exemplary embodiment, the providing the column spacer may include forming a contact hole on the insulation layer, the contact hole partially exposing the first electrode, and forming the column spacer on the contact hole.

In an exemplary embodiment, the providing the column spacer may include forming a contact hole on the insulation layer, wherein the contact hole exposes a portion of the first electrode, providing an adhesive pattern on the contact hole, and providing the column spacer on the adhesive pattern.

In an exemplary embodiment, the adhesive pattern includes substantially the same material as the first electrode.

In an exemplary embodiment, the providing the column spacer may include providing an adhesive electrode on the insulation layer, and providing the column spacer on the adhesive electrode.

In an exemplary embodiment, the adhesive electrode may include substantially the same material as the first electrode.

In an exemplary embodiment, the column spacer may directly contact the adhesive electrode.

In an exemplary embodiment, a thickness of the insulation layer may be greater than or equal to about 1.8 μm and less than or equal to about 2.2 μm.

According to exemplary embodiments, a display substrate includes a column spacer on a contact hole and directly contacting a common electrode. Thus, it may be prevented that the column spacer on a counter substrate scratches an alignment film on a base substrate.

In such embodiments, a display substrate includes a column spacer on an adhesive pattern. Thus, it may be prevented that the column spacer on the counter substrate scratches the alignment film on the base substrate.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

Figure 1:
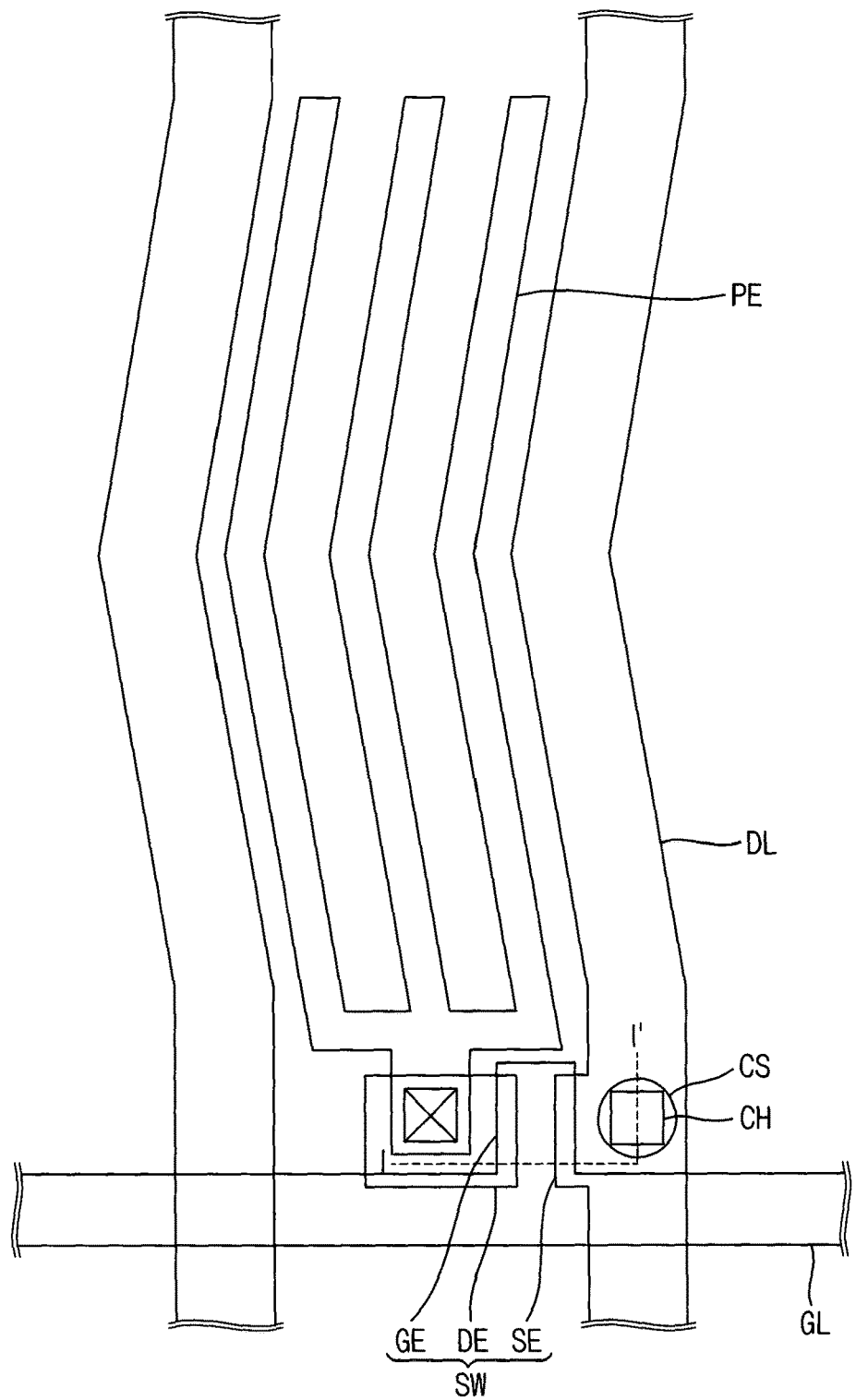
FIG. 1 is a plan view illustrating a display substrate according to an exemplary embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 2:
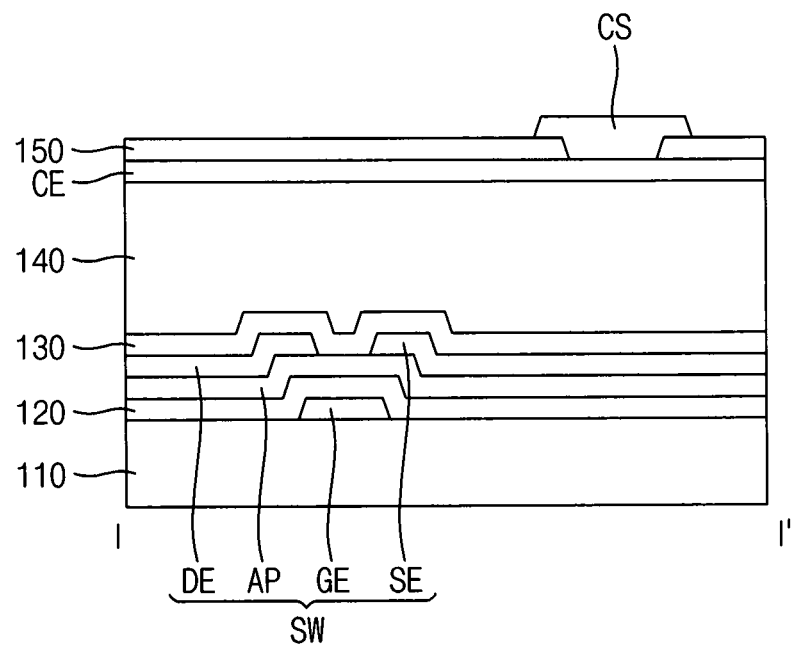
FIG. 2 is a cross-sectional view taken along line I-I' of FIG. 1.

FIG. 1 is a plan view illustrating a display substrate according to exemplary embodiments of the invention. FIG. 2 is a cross-sectional view taken along line I-I' of FIG. 1.

Referring to FIGS. 1 and 2, an exemplary embodiment of the display substrate includes a base substrate 110, a gate metal pattern including a gate line GL and a gate electrode GE, a data metal pattern including a data line DL, a source electrode SE and a drain electrode DE, a first insulation layer 120, an active pattern AP, a second insulation layer 130, an organic layer 140, a common electrode CE, a third insulation layer 150, a pixel electrode PE, and a column spacer CS.

The gate line GL extends in a first direction. The gate line GL may have a single layer structure including at least one of copper (Cu), silver (Ag), chrome (Cr), molybdenum (Mo), aluminum (Al), titanium (Ti), manganese (Mn) and a mixture thereof. Alternatively, the gate line GL may have a multi-layer structure including a plurality of metal layers including materials different from each other. The gate line GL is electrically connected to the gate electrode GE of a switching element SW. A portion of the gate line GL may form or define the gate electrode GE.

A first insulation layer 120 is disposed on the gate line GL and the gate electrode GE. The first insulation layer 120 may include an inorganic material. In one exemplary embodiment, for example, the first insulation layer 120 may include silicon oxide (SiOx) and/or silicon nitride (SiNx). In one exemplary embodiment, for example, the first insulation layer 120 may include silicon oxide (SiOx), and may have a thickness of about 500 angstrom (Å). In an exemplary embodiment, the first insulation layer 120 may include a plurality of layers including materials different from each other.

An active pattern AP is disposed on the first insulation layer 120. The active pattern AP may include an oxide semiconductor. In one exemplary embodiment, for example, the oxide semiconductor may include zinc oxide (ZnO), zinc tin oxide ("ZTO"), zinc indium oxide ("ZIO"), indium oxide (InO), titanium oxide (TiO), indium gallium zinc oxide ("IGZO"), indium zinc tin oxide ("IZTO") or a combination/mixture thereof. In one exemplary embodiment, for example, the oxide semiconductor may include IGZO.

A data metal pattern is disposed on the active pattern AP. The data metal pattern may include the data line DL, a source electrode SE and the drain electrode DE. The data line DL is electrically connected to the source electrode SE. The data line DL may be disposed in or directly on a same layer as the source electrode SE and the drain electrode DE.

A second insulation layer 130 is disposed on the source electrode SE and the drain electrode DE. The second insulation layer 130 may include an inorganic material. In one exemplary embodiment, for example, the second insulation layer 130 may include silicon oxide (SiOx) and/or silicon nitride (SiNx). In one exemplary embodiment, for example, the second insulation layer 130 may include silicon oxide (SiOx), and may have a thickness of about 500 Å. In an exemplary embodiment, the second insulation layer 130 may have a multi-layer structure including materials different from each other.

An organic layer 140 is disposed on the second insulation layer 130. The organic layer 140 planarizes an upper surface of the display substrate so that problems due to the step such as disconnection of a signal line may be effectively prevented. The organic layer 140 may be an insulation layer including an organic material.

A common electrode CE is disposed on the organic layer 140. The common electrode CE may include a transparent conductive material, such as indium tin oxide ("ITO") and indium zinc oxide ("IZO"). In an exemplary embodiment, the common electrode CE may include titanium (Ti) and/or molybdenum titanium (MoTi). A common voltage is applied to the common electrode CE.

A third insulation layer 150 is disposed on the common electrode CE. The third insulation layer 150 may include an inorganic material such as silicon oxide (SiOx) and/or silicon nitride (SiNx). In one exemplary embodiment, for example, the third insulation layer 150 includes silicon oxide (SiOx), and may have a thickness greater than or equal to about 1.8 μm and less than or equal to about 2.2 μm. In an exemplary embodiment, the third insulation layer 150 may include a plurality of layers including different materials from each other.

A contact hole CH is defined in the third insulation layer 150 and exposes a portion of the common electrode CE. A column spacer CS is disposed on or in the contact hole CH. The column spacer CS may directly contact the exposed portion of the common electrode CE. The column spacer CS may contact another column spacer (not shown) disposed on a counter substrate opposing the base substrate 110. If the column spacer CS is not formed, the column spacer (not shown) disposed on the counter substrate may scratch an alignment film disposed on the base substrate 110, such that the display substrate may have some defects.

Both of the common electrode CE and the column spacer CS may comprise hydrophobic material. Alternatively, both the common electrode CE and the column spacer CS may comprise hydrophilic material. Accordingly, the common electrode CE and the column spacer CS can be adhesive to each other.

According to exemplary embodiments, a display substrate includes a column spacer CS disposed on a contact hole CH and directly contacting a common electrode CE. Thus, it may be effectively prevented that a column spacer disposed on a counter substrate scratches an alignment film on a base substrate 110.

FIGS. 3 to 6 are cross-sectional views illustrating an exemplary embodiment of a method of manufacturing the display substrate of FIG. 2.

Figure 3:
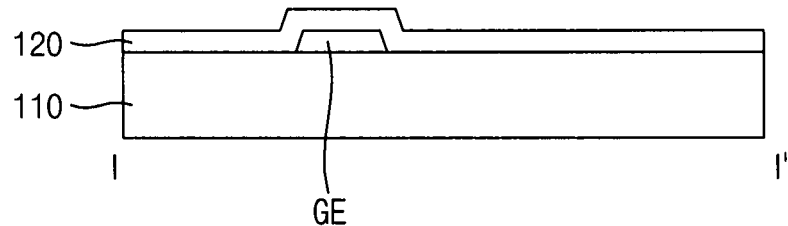
FIGS. 3 to 6 are cross-sectional views illustrating an exemplary embodiment of a method of manufacturing the display substrate of FIG. 2.

Referring to FIG. 3, a gate electrode GE and a first insulation layer 120 are formed on a base substrate 110.

In one exemplary embodiment, for example, a gate metal layer is provided or formed on the base substrate 110, and the gate metal layer is patterned, to form the gate line GL and the gate electrode GE. A glass substrate, a quartz substrate, a silicon substrate, a plastic substrate or the like may be used as the base substrate 110.

The gate metal layer may include copper (Cu), silver (Ag), chrome (Cr), molybdenum (Mo), aluminum (Al), titanium (Ti), manganese (Mn), aluminum (Al), and/or an alloy thereof. The gate metal layer may have a single layer structure or a multi-layer structure having a plurality of metal layers including materials different from each other. In one exemplary embodiment, for example, the gate metal layer may include a copper layer and a titanium layer formed on an upper portion and/or a lower portion of the copper layer.

In such an embodiment, the first insulation layer 120 is provided or formed to cover the gate line GL and the gate electrode GE. The first insulation layer 120 may include silicon nitride, silicon oxide, or the like. The first insulation layer 120 may have a single layer structure or a multi-layer structure. In one exemplary embodiment, for example, the first insulation layer 120 may include a lower insulation layer including silicon nitride and an upper insulation layer including silicon oxide.

Figure 4:
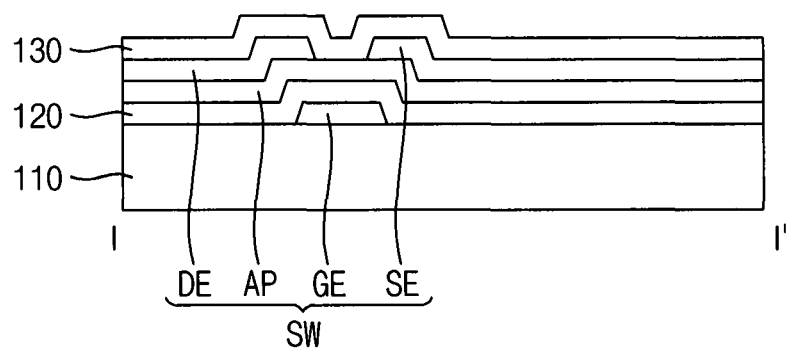

Referring to FIG. 4, an active pattern AP, a source electrode SE, a drain electrode DE and a second insulation layer 130 are provided or formed on the base substrate 110 on which the first insulation layer 120 is provided.

The active pattern AP is provided or formed on the first insulation layer 120. The active pattern AP may include an oxide semiconductor. In one exemplary embodiment, for example, the oxide semiconductor may include zinc oxide (ZnO), ZTO, ZIO, indium oxide (InO), titanium oxide (TiO), IGZO, IZTO or a combination/mixture thereof. In one exemplary embodiment, for example, the oxide semiconductor may include IGZO.

The data metal pattern is provided or formed on the active pattern AP. The data metal pattern may include the data line DL, the source electrode SE and the drain electrode DE. The data line DL is electrically connected to the source electrode SE. The data line DL may be provide or formed in or directly on a same layer as the source electrode SE and the drain electrode DE.

The second insulation layer 130 is provided or formed on the source electrode SE and the drain electrode DE. The second insulation layer 130 may include inorganic material. In one exemplary embodiment, for example, the second insulation layer 130 may include silicon oxide (SiOx) or silicon nitride (SiNx). In one exemplary embodiment, for example, the second insulation layer 130 may include silicon oxide (SiOx), and may have a thickness of about 500 Å. In an exemplary embodiment, the second insulation layer 130 may have a multi-layer structure including materials different from each other.

Figure 5:
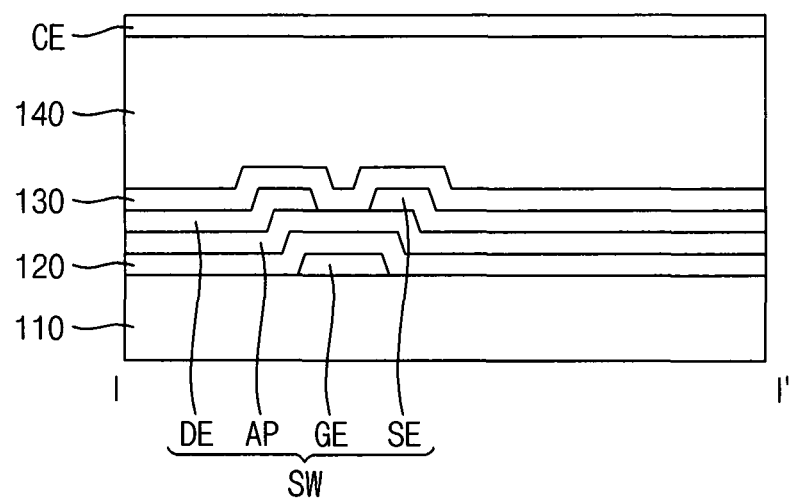

Referring to FIG. 5, an organic layer 140 and a common electrode CE is provided or formed on the base substrate 110 on which the second insulation layer 130 is provided.

The organic layer 140 is provided or formed on the second insulation layer 130. The organic layer 140 planarizes an upper surface of the display substrate so that problems due to the step such as disconnection of a signal line may be prevented. The organic layer 140 may be an insulation layer including an organic material.

The common electrode CE is provided or formed on the organic layer 140. The common electrode CE may include a transparent conductive material, such as ITO and IZO. In an exemplary embodiment, the common electrode CE may include titanium (Ti) and/or molybdenum titanium (MoTi). A common voltage is applied to the common electrode CE.

Figure 6:
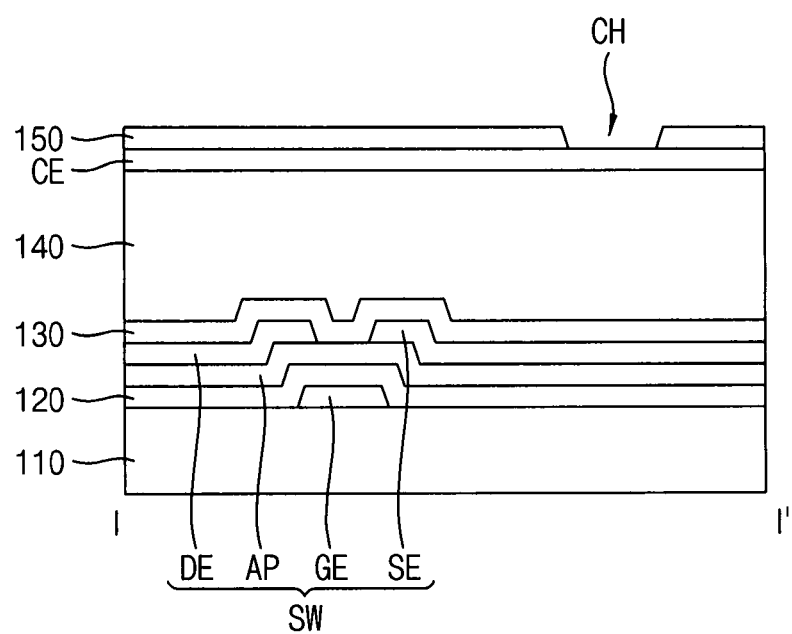

Referring to FIG. 6, a third insulation layer 150 is provided or formed on the base substrate 110 on which the common electrode CE is provided. Then, the third insulation layer 150 is patterned to form a contact hole CH.

The third insulation layer 150 is provided or formed on the common electrode CE. The third insulation layer 150 may include an inorganic material such as silicon oxide (SiOx) and/or silicon nitride (SiNx). In one exemplary embodiment, for example, the third insulation layer 150 includes silicon oxide (SiOx), and may have a thickness greater than or equal to about 1.8 µm and less than or equal to about 2.2 µm. In an exemplary embodiment, the third insulation layer 150 may include a plurality of layers including different materials from each other.

The contact hole CH is formed in the third insulation layer 150 to expose a portion of the common electrode CE.

Referring back to FIG. 2, a column spacer CS is provided or formed on the base substrate 110 on which the third insulation layer 150 is formed.

The column spacer CS is provided or formed in or on the contact hole CH. The column spacer CS may directly contact the exposed portion of the common electrode CE.

Figure 7:
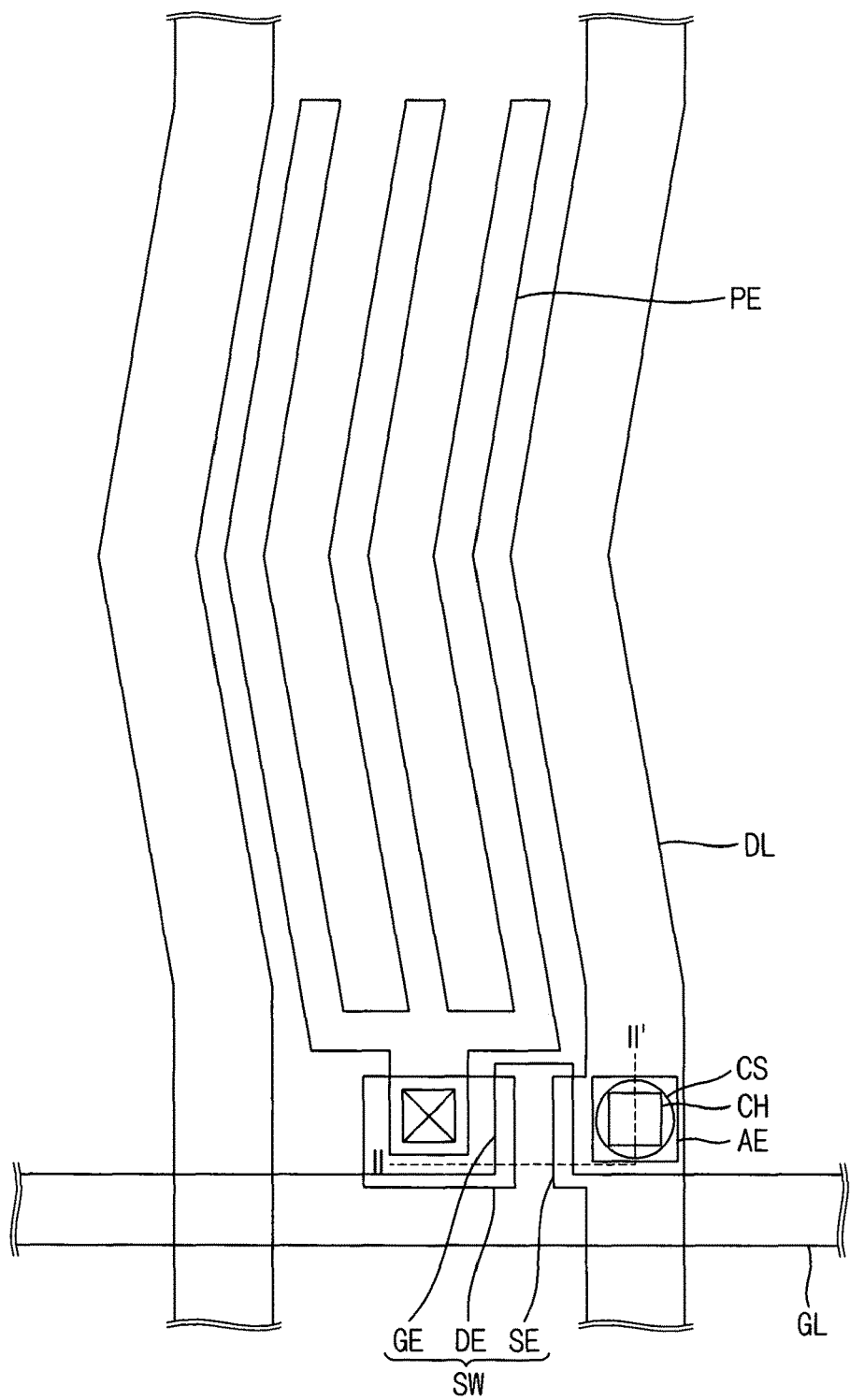
FIG. 7 is a plan view illustrating a display substrate according to an alternative exemplary embodiment of the invention.
Figure 8:
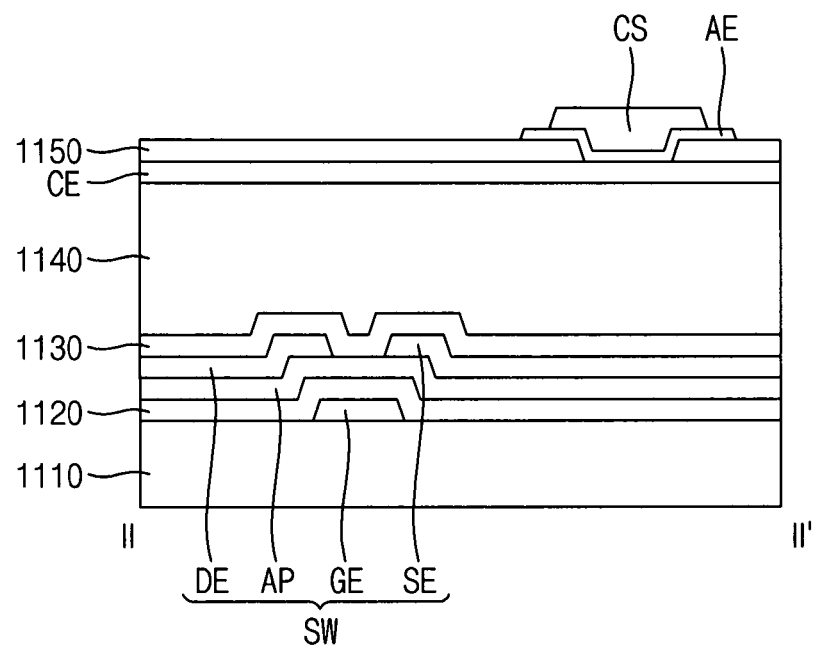
FIG. 8 is a cross-sectional view taken along line II-IF of FIG. 7.

FIG. 7 is a plan view illustrating a display substrate according to an alternative exemplary embodiment of the invention. FIG. 8 is a cross-sectional view taken along line II-IF of FIG. 7.

The display substrate shown in FIGS. 7 and 8 is substantially the same as the display substrate of FIGS. 1 and 2 except for an adhesive pattern AE. Thus, the same reference numerals will be used to refer to same or like parts as those described in the exemplary embodiment described above, and any repetitive detailed description thereof will be omitted or simplified.

Referring to FIGS. 7 and 8, an exemplary embodiment of the display substrate includes a base substrate 1110, a gate metal pattern including a gate line GL and a gate electrode GE, a data metal pattern including a data line DL, a source electrode SE and a drain electrode DE, a first insulation layer 1120, an active pattern AP, a second insulation layer 1130, an organic layer 1140, a common electrode CE, a third insulation layer 1150, a pixel electrode PE and a column spacer CS.

In such an embodiment, a contact hole CH is defined in the third insulation layer 1150 and exposes a portion of the common electrode CE. An adhesive pattern AE is disposed on the contact hole CH. The adhesive pattern AE covers the contact hole CH. The adhesive pattern AE may directly contact the exposed portion of the common electrode CE. The adhesive pattern AE may include substantially the same material as the common electrode CE. The adhesive pattern AE may include a transparent conductive material, such as ITO and IZO. In an exemplary embodiment, the adhesive pattern AE may include titanium (Ti) and/or molybdenum titanium (MoTi).

A column spacer CS is disposed on the adhesive pattern AE. The column spacer CS may directly contact the adhesive pattern AE. The column spacer CS may contact another column spacer (not shown) disposed on a counter substrate opposing the base substrate 1110. If the column spacer CS is not provided, the column spacer (not shown) on the counter substrate may scratch an alignment film formed on the base substrate 1110, such that the display substrate may have some defects.

Both of the adhesive pattern AE and the column spacer CS may comprise hydrophobic material. Alternatively, both the adhesive pattern AE and the column spacer CS may comprise hydrophilic material. Accordingly, the adhesive pattern AE and the column spacer CS can be adhesive to each other.

According to exemplary embodiments, a display substrate includes a column spacer CS disposed in a contact hole CH and on a common electrode CE. Thus, it may be prevented that a column spacer formed on a counter substrate scratches an alignment film on a base substrate 1110.

FIGS. 9 to 12 are cross-sectional views illustrating an exemplary embodiment of a method of manufacturing the display substrate of FIG. 8.

Figure 9:
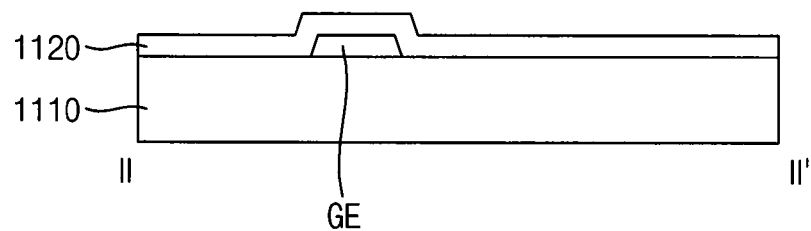
FIGS. 9 to 12 are cross-sectional views illustrating an exemplary embodiment of a method of manufacturing the display substrate of FIG. 8.

Referring to FIG. 9, a gate electrode GE and a first insulation layer 1120 are provided or formed on a base substrate 1110.

In one exemplary embodiment, for example, a gate metal layer is provided or formed on the base substrate 1110, and the gate metal layer is patterned, to form the gate line GL and the gate electrode GE. A glass substrate, a quartz substrate, a silicon substrate, a plastic substrate or the like may be used as the base substrate 1110.

The gate metal layer may include copper (Cu), silver (Ag), chrome (Cr), molybdenum (Mo), aluminum (Al), titanium (Ti), manganese (Mn), aluminum (Al), and/or an alloy thereof. The gate metal layer may have a single layer structure or a multi-layer structure having a plurality of metal layers including materials different from each other. In one exemplary embodiment, for example, the gate metal layer may include a copper layer and a titanium layer formed on an upper portion and/or a lower portion of the copper layer.

In such an embodiment, the first insulation layer 1120 is provided or formed covering the gate line GL and the gate electrode GE. The first insulation layer 1120 may include silicon nitride, silicon oxide, or the like. The first insulation layer 1120 may have a single layer structure or a multi-layer structure. In one exemplary embodiment, for example, the first insulation layer 1120 may include a lower insulation layer including silicon nitride and an upper insulation layer including silicon oxide.

Figure 10:
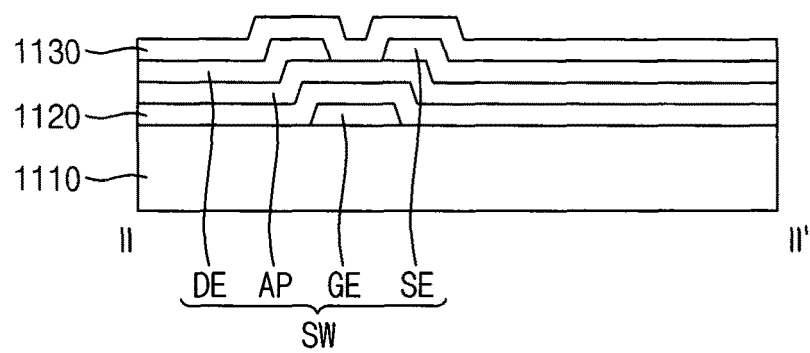

Referring to FIG. 10, an active pattern AP, a source electrode SE, a drain electrode DE and a second insulation layer 1130 are provided or formed on the base substrate 1110 on which the first insulation layer 1120 is provided.

The active pattern AP is provided or formed on the first insulation layer 1120. The active pattern AP may include an oxide semiconductor. In one exemplary embodiment, for example, the oxide semiconductor may include zinc oxide (ZnO), ZTO, ZIO, indium oxide (InO), titanium oxide (TiO), IGZO, IZTO or a combination/mixture thereof. In one exemplary embodiment, for example, the oxide semiconductor may include IGZO.

The data metal pattern is provided or formed on the active pattern AP. The data metal pattern may include the data line DL, the source electrode SE and the drain electrode DE. The data line DL is electrically connected to the source electrode SE. The data line DL may be formed on the layer on which the source electrode SE and the drain electrode DE are formed.

The second insulation layer 1130 is provided or formed on the source electrode SE and the drain electrode DE. The second insulation layer 1130 may include inorganic material. In one exemplary embodiment, for example, the second insulation layer 1130 may include silicon oxide (SiOx) or silicon nitride (SiNx). In one exemplary embodiment, for example, the second insulation layer 1130 may include silicon oxide (SiOx), and may have a thickness of about 500 Å. In an exemplary embodiment, the second insulation layer 1130 may have a multi-layer structure including materials different from each other.

Figure 11:
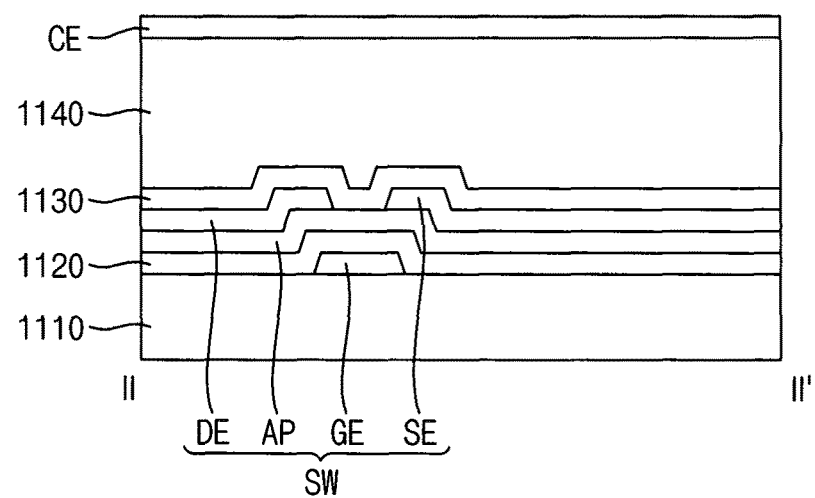

Referring to FIG. 11, an organic layer 1140 and a common electrode CE is provided or formed on the base substrate 1110 on which the second insulation layer 1130 is provided.

The organic layer 1140 is provided or formed on the second insulation layer 1130. The organic layer 1140 planarizes an upper surface of the display substrate so that problems due to the step such as disconnection of a signal line may be prevented. The organic layer 1140 may be an insulation layer including an organic material.

The common electrode CE is provided or formed on the organic layer 1140. The common electrode CE may include a transparent conductive material, such ITO and IZO. In an exemplary embodiment, the common electrode CE may include titanium (Ti) and/or molybdenum titanium (MoTi). A common voltage is applied to the common electrode CE.

Figure 12:
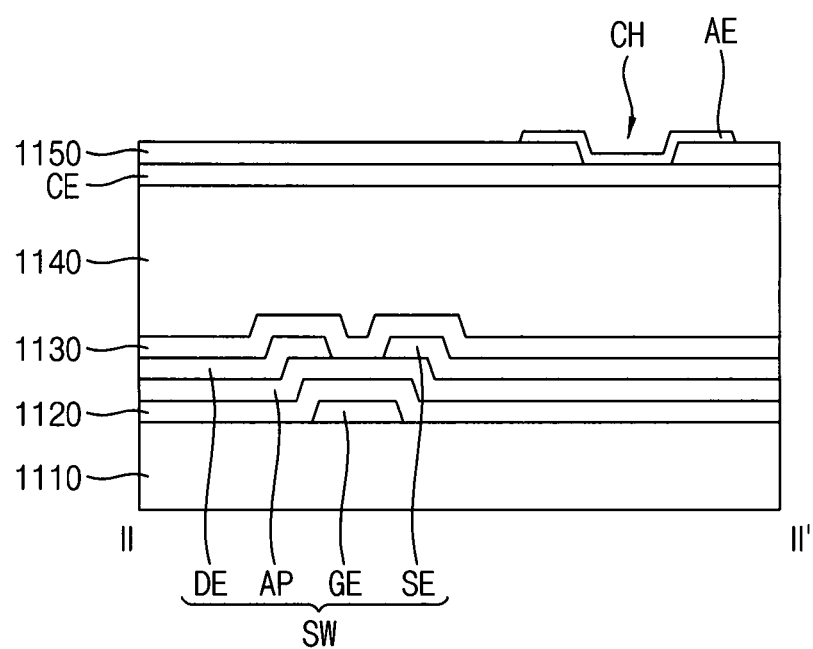

Referring to FIG. 12, a third insulation layer 1150 is provided or formed on the base substrate 1110 on which the common electrode CE is provided. Then, the third insulation layer 1150 is patterned to form a contact hole CH. An adhesive pattern AE is provided or formed on the contact hole CH.

The third insulation layer 1150 is provided or formed on the common electrode CE. The third insulation layer 1150 may include an inorganic material such as silicon oxide (SiOx) and/or silicon nitride (SiNx). In one exemplary embodiment, for example, the third insulation layer 1150 includes silicon oxide (SiOx), and may have a thickness greater than or equal to about 1.8 μm and less than or equal to about 2.2 μm. In an exemplary embodiment, the third insulation layer 1150 may include a plurality of layers including different materials from each other.

A contact hole CH is formed in the third insulation layer 1150 and exposes a portion of the common electrode CE. An adhesive pattern AE is provided or formed on the contact hole CH. The adhesive pattern AE covers the contact hole CH. The adhesive pattern AE may directly contact the exposed portion of the common electrode CE. The adhesive pattern AE may include substantially the same material as the common electrode CE. The adhesive pattern AE may include a transparent conductive material, such as ITO and IZO. In an exemplary embodiment, the adhesive pattern AE may include titanium (Ti) and/or molybdenum titanium (MoTi).

Referring to FIG. 8, a column spacer CS is provided or formed on the base substrate 1110 on which the adhesive pattern AE is provided.

The column spacer CS is provided on the adhesive pattern AE. The column spacer CS may directly contact the adhesive pattern AE.

Figure 13:
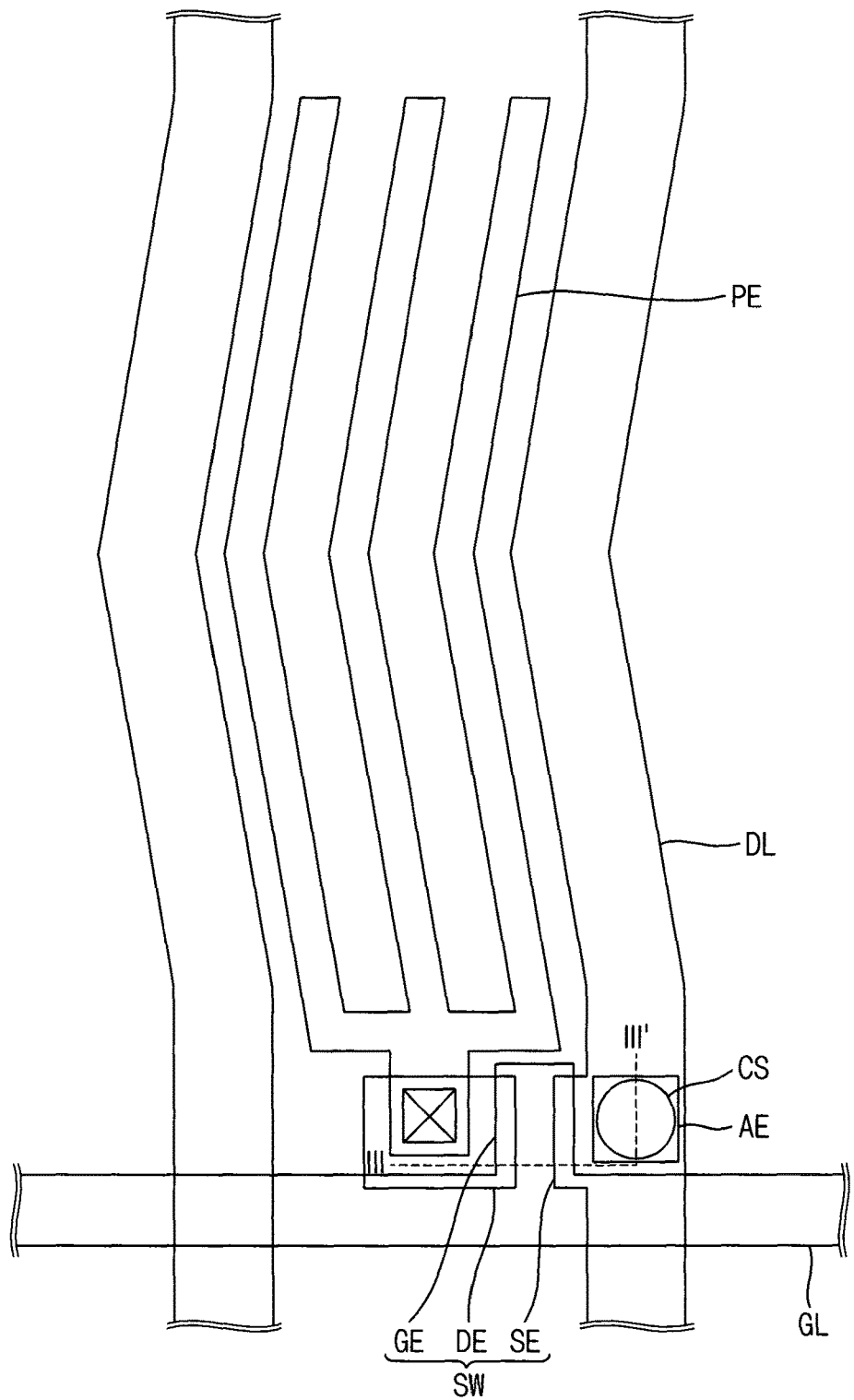
FIG. 13 is a plan view illustrating a display substrate according to another alternative exemplary embodiment of the invention.
Figure 14:
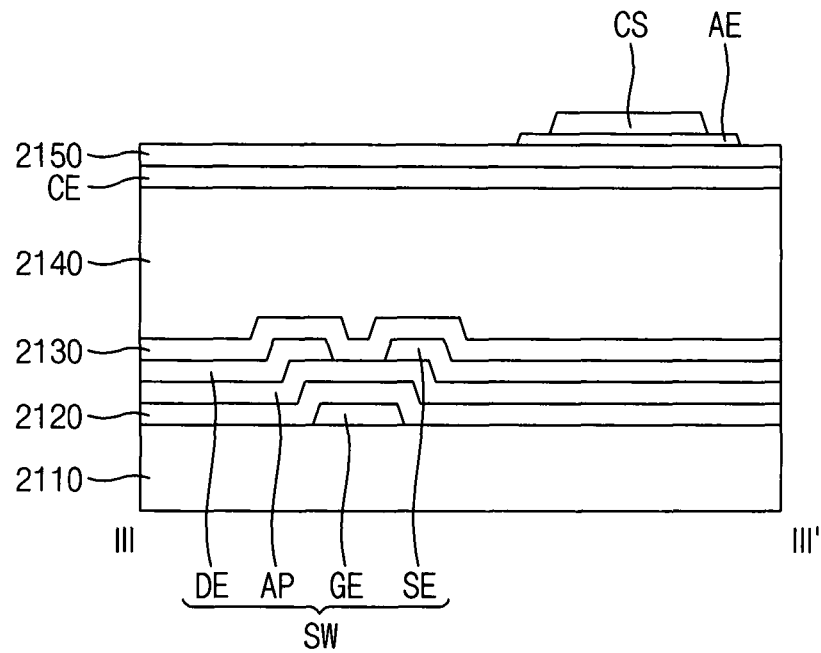
FIG. 14 is a cross-sectional view taken along line of FIG. 13.

FIG. 13 is a plan view illustrating a display substrate according to another alternative exemplary embodiment of the invention. FIG. 14 is a cross-sectional view taken along line III-III' of FIG. 13.

A display substrate shown in FIGS. 13 and 14 is substantially the same as the display substrate of FIGS. 1 and 2 except for the third insulation layer 2150 and the adhesive pattern AE. Thus, the same reference numerals will be used to refer to same or like parts as those described in the previous exemplary embodiment, and any repetitive detailed descriptions thereof will be omitted or simplified.

Referring to FIGS. 13 and 14, an exemplary embodiment of the display substrate includes a base substrate 2110, a gate metal pattern including a gate line GL and a gate electrode GE, a data metal pattern including a data line DL, a source electrode SE and a drain electrode DE, a first insulation layer 2120, an active pattern AP, a second insulation layer 2130, an organic layer 2140, a common electrode CE, a third insulation layer 2150, a pixel electrode PE, and a column spacer CS.

An adhesive pattern AE is disposed on the third insulation layer 2150. In such an embodiment, a contact hole is not defined in the third insulation layer 2150. The adhesive pattern AE may include substantially the same material as the common electrode CE. The adhesive pattern AE may include a transparent conductive material, such as ITO and IZO. In an exemplary embodiment, the adhesive pattern AE may include titanium (Ti) and/or molybdenum titanium (MoTi).

A column spacer CS is disposed on the adhesive pattern AE. The column spacer CS may directly contact the adhesive pattern AE. The column spacer CS may contact another column spacer (not shown) disposed on a counter substrate opposing the base substrate 2110. If the column spacer CS is not formed, the column spacer (not shown) on the counter substrate may scratch an alignment film on the base substrate 2110, then the display substrate may have some defects.

Both of the adhesive pattern AE and the column spacer CS may comprise hydrophobic material. Alternatively, both the adhesive pattern AE and the column spacer CS may comprise hydrophilic material. Accordingly, the adhesive pattern AE and the column spacer CS can be adhesive to each other.

According to exemplary embodiments, a display substrate includes a column spacer CS disposed on an adhesive pattern AE. Thus, it may be prevented that a column spacer formed on a counter substrate scratches an alignment film on a base substrate 2110.

FIGS. 15 to 18 are cross-sectional views illustrating an exemplary embodiment of a method of manufacturing the display substrate of FIG. 14.

Figure 15:
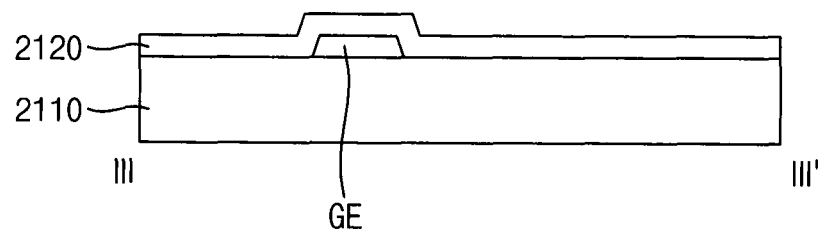
FIGS. 15 to 18 are cross-sectional views illustrating an exemplary embodiment of a method of manufacturing the display substrate of FIG. 14.

Referring to FIG. 15, a gate electrode GE and a first insulation layer 2120 are provided or formed on a base substrate 2110.

In one exemplary embodiment, for example, a gate metal layer is provided or formed on the base substrate 2110, and the gate metal layer is patterned, to form the gate line GL and the gate electrode GE. A glass substrate, a quartz substrate, a silicon substrate, a plastic substrate, or the like may be used as the base substrate 2110.

The gate metal layer may include copper (Cu), silver (Ag), chrome (Cr), molybdenum (Mo), aluminum (Al), titanium (Ti), manganese (Mn), aluminum (Al), and/or an alloy thereof. The gate metal layer may have a single layer structure or a multi-layer structure having a plurality of metal layers including materials different from each other. In one exemplary embodiment, for example, the gate metal layer may include a copper layer and a titanium layer on an upper portion and/or a lower portion of the copper layer.

In such an embodiment, the first insulation layer 2120 is provided or formed covering the gate line GL and the gate electrode GE. The first insulation layer 2120 may include silicon nitride, silicon oxide, or the like. The first insulation layer 2120 may have a single layer structure or a multi-layer structure. In one exemplary embodiment, for example, the first insulation layer 2120 may include a lower insulation layer including silicon nitride and an upper insulation layer including silicon oxide.

Figure 16:
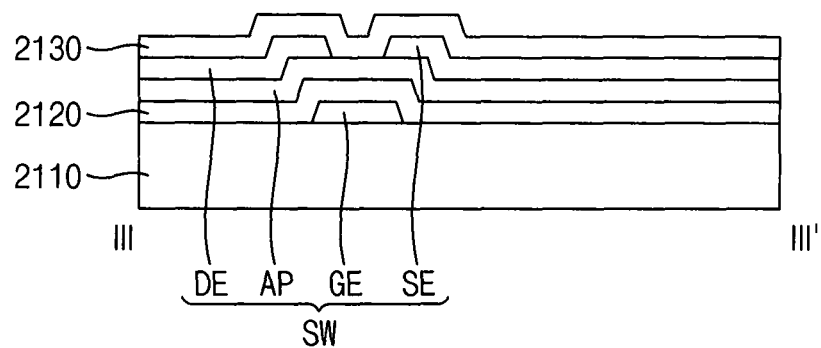

Referring to FIG. 16, an active pattern AP, a source electrode SE, a drain electrode DE and a second insulation layer 2130 are provided or formed on the base substrate 2110 on which the first insulation layer 2120 is provided.

The active pattern AP is provided or formed on the first insulation layer 2120. The active pattern AP may include an oxide semiconductor. In one exemplary embodiment, for example, the oxide semiconductor may include zinc oxide (ZnO), ZTO, ZIO, indium oxide (InO), titanium oxide (TiO), IGZO, IZTO or a combination/mixture thereof. In one exemplary embodiment, for example, the oxide semiconductor may include IGZO.

The data metal pattern is provided or formed on the active pattern AP. The data metal pattern may include the data line DL, the source electrode SE and the drain electrode DE. The data line DL is electrically connected to the source electrode SE. The data line DL may be provided or formed in or directly on a same layer as the source electrode SE and the drain electrode DE.

The second insulation layer 2130 is provided or formed on the source electrode SE and the drain electrode DE. The second insulation layer 2130 may include inorganic material. In one exemplary embodiment, for example, the second insulation layer 2130 may include silicon oxide (SiOx) or silicon nitride (SiNx). In one exemplary embodiment, for example, the second insulation layer 2130 may include silicon oxide (SiOx), and may have a thickness of about 500 Å. In an exemplary embodiment, the second insulation layer 2130 may have a multi-layer structure including materials different from each other.

Figure 17:
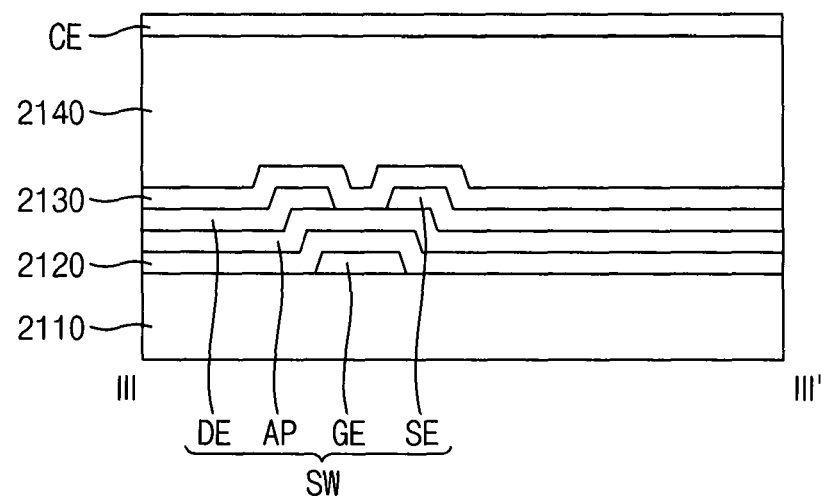

Referring to FIG. 17, an organic layer 2140 and a common electrode CE is provided or formed on the base substrate 2110 on which the second insulation layer 2130 is formed.

The organic layer 2140 is provided or formed on the second insulation layer 2130. The organic layer 2140 planarizes an upper surface of the display substrate so that problems due to the step such as disconnection of a signal line may be prevented. The organic layer 2140 may be an insulation layer including an organic material.

The common electrode CE is provided or formed on the organic layer 2140. The common electrode CE may include a transparent conductive material, such as ITO and IZO. In an exemplary embodiment, the common electrode CE may include titanium (Ti) and/or molybdenum titanium (MoTi). A common voltage is applied to the common electrode CE.

Figure 18:
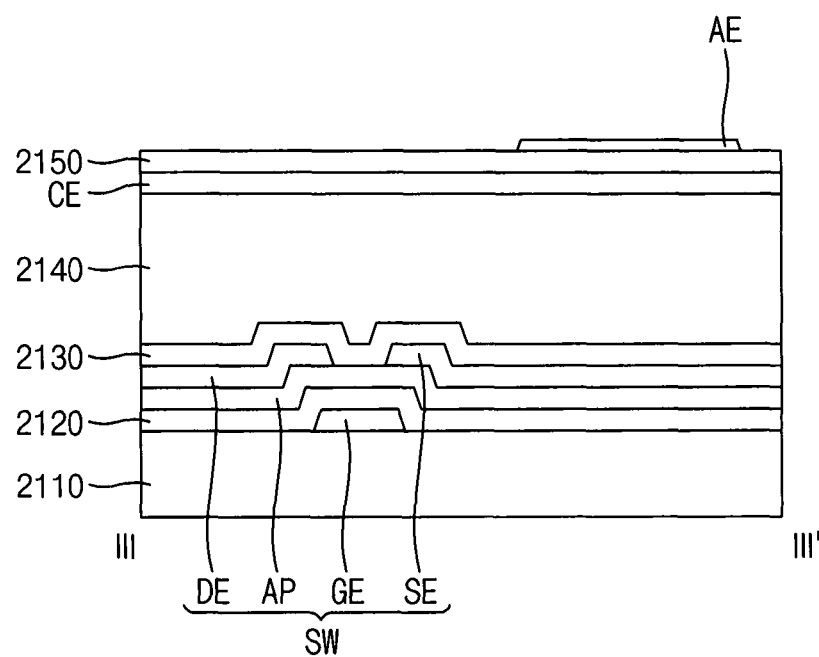

Referring to FIG. 18, a third insulation layer 2150 is provided or formed on the base substrate 2110 on which the common electrode CE is provided. Then, an adhesive pattern AE is provided or formed on the third insulation layer 2150.

The third insulation layer 2150 is provided or formed on the common electrode CE. The third insulation layer 2150 may include an inorganic material such as silicon oxide (SiOx) and/or silicon nitride (SiNx). In one exemplary embodiment, for example, the third insulation layer 2150 includes silicon oxide (SiOx), and may have a thickness greater than or equal to about 1.8 μm and less than or equal to about 2.2 μm. In an exemplary embodiment, the third insulation layer 2150 may include a plurality of layers including different materials from each other.

An adhesive pattern AE is provided or formed on the third insulation layer 2150. The adhesive pattern AE may include substantially the same material as the common electrode CE includes. The adhesive pattern AE may include a transparent conductive material, such as ITO and IZO. In an exemplary embodiment, the adhesive pattern AE may include titanium (Ti) and/or molybdenum titanium (MoTi).

Referring to FIG. 14, a column spacer CS is provided or formed on the base substrate 2110 on which the adhesive pattern AE is provided.

A column spacer CS is provided or formed on the adhesive pattern AE. The column spacer CS may directly contact the adhesive pattern AE.

According to exemplary embodiments of the invention, a display substrate includes a column spacer formed on a contact hole and directly contacting a common electrode. Thus, it may be prevented that a column spacer on a counter substrate scratches an alignment film on a base substrate.

In an exemplary embodiment, a display substrate includes a column spacer on an adhesive pattern. Thus, it may be prevented that a column spacer on a counter substrate scratches an alignment film on a base substrate.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
   a base substrate;
   a switching element disposed on the base substrate, wherein the switching element comprises a gate electrode, a source electrode, and a drain electrode;
   a first layer disposed on the switching element;
   a first electrode disposed on the first layer;
   an insulation layer disposed on the first electrode, wherein a contact hole is defined in the insulation layer to expose a portion of the first electrode; and
   a spacer disposed on the contact hole in the insulation layer,
   wherein the spacer is not overlapped with the gate electrode.

2. The display substrate of claim 1, wherein the spacer directly contacts the exposed portion of the first electrode.

3. The display substrate of claim 2, wherein a thickness of the insulation layer is greater than or equal to about 1.8 micrometers and less than or equal to about 2.2 micrometers.

4. The display substrate of claim 1, further comprising:
   an adhesive pattern disposed on the insulation layer to cover the contact hole.

5. The display substrate of claim 4, wherein the spacer directly contacts the adhesive pattern.

6. The display substrate of claim 4, wherein the adhesive pattern comprises substantially the same material as the first electrode.

7. The display substrate of claim 4, wherein the adhesive pattern directly contacts the first electrode.

8. The display substrate of claim 4, wherein a thickness of the insulation layer is greater than or equal to about 1.8 micrometers and less than or equal to about 2.2 micrometers.

9. A method of manufacturing a display substrate, the method comprising:
   providing a switching element on a base substrate, wherein the switching element comprises a gate electrode electrically connected to a gate line extending in a first direction, a source electrode electrically connected to a data line extending in a second direction crossing the first direction, and a drain electrode spaced apart from the source electrode;
   providing a first layer on the switching element;
   providing a first electrode on the first layer;
   providing an insulation layer on the first layer;
   forming a contact hole in the insulation layer, wherein the contact hole exposes a portion of the first electrode; and
   providing a spacer on the contact hole,
   wherein the spacer is not overlapped with the gate electrode.

10. The method of claim 9, wherein the providing the further comprising:
    providing an adhesive pattern under the spacer.

11. The method of claim 10, wherein the adhesive pattern comprises substantially the same material as the first electrode.

12. The method of claim 9, wherein forming the spacer comprises:
    providing an adhesive electrode on the insulation layer; and
    providing the spacer on the adhesive electrode.

13. The method of claim 12, wherein the adhesive electrode comprises substantially the same material as the first electrode.

14. The method of claim 12, wherein the spacer directly contacts the adhesive electrode.

15. The method of claim 12, wherein a thickness of the insulation layer is greater than or equal to about 1.8 micrometers and less than or equal to about 2.2 micrometers.

* * * * *